United States Patent
McClellan

(10) Patent No.: US 6,735,724 B1
(45) Date of Patent: May 11, 2004

(54) DETECTION ERROR ESTIMATION AND METHOD

(75) Inventor: Brett A. McClellan, Laguna Hills, CA (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/545,395

(22) Filed: Apr. 7, 2000

Related U.S. Application Data

(60) Provisional application No. 60/128,341, filed on Apr. 8, 1999.

(51) Int. Cl.[7] .......................... G06F 11/00; H03M 13/25; H03M 13/41; H03M 13/43; H03M 13/45
(52) U.S. Cl. .................. 714/704; 714/792; 714/794; 714/795; 714/796
(58) Field of Search ................ 714/704, 774, 714/780, 792–796, 789, 788; 365/262; 375/329, 341

(56) References Cited

U.S. PATENT DOCUMENTS

| | | | | |
|---|---|---|---|---|
| 4,641,327 A | * | 2/1987 | Wei ........................... 375/365 |
| 5,128,967 A | * | 7/1992 | Durkin et al. ............. 375/329 |
| 5,208,816 A | * | 5/1993 | Seshardi et al. .......... 714/795 |
| 5,229,767 A | * | 7/1993 | Winter et al. ................ 341/50 |
| 5,524,027 A | * | 6/1996 | Huisken .................... 375/341 |
| 5,574,737 A | * | 11/1996 | Mizutani et al. ............ 714/789 |
| 5,838,697 A | * | 11/1998 | Abe ............................. 714/796 |
| 5,923,666 A | * | 7/1999 | Gledhill et al. ............. 370/480 |
| 5,937,016 A | * | 8/1999 | Choi ........................... 375/341 |
| 6,005,898 A | * | 12/1999 | Kaewell, Jr. ............... 375/341 |
| 6,009,549 A | * | 12/1999 | Bliss et al. .................... 360/51 |
| 6,101,227 A | * | 8/2000 | Glover ........................ 375/262 |
| 6,108,374 A | * | 8/2000 | Balachandran et al. ..... 375/227 |
| 6,141,388 A | * | 10/2000 | Servais et al. .............. 375/262 |
| 6,215,827 B1 | * | 4/2001 | Balachandran et al. ..... 375/262 |

OTHER PUBLICATIONS

"A Reduced complexity EPR4 Post Processor" by Fitzpatrick IEEE Transcations on Magnetics Vol 34 Jan. 1998.*
"Non–Linear MAP Estimation using a Continous–State Viterbi Algorithm" by Champlin et al. Proceedingsof the 31st Confrence on Decision and Control Dec. 1992.*
"Exact Bounds for Viterbi Detector Path Metric Difference" Siegel et al. Acoustics, Speech, and Signal Processing, 1991 International Conference.*
"A Lower Bound on the Mismatched Viterbi Decoding Bit–Error–Rate"—Lapidoth et al. IEEE International Symposium on Information Theory. 1997. Proceedings., On page(s): 433.*
"Metric for Noncoherent Sequence Estimation"—Schober et al., Electronics Letters On page(s): 2178–2179 Dec. 9, 1999 vol.: 35 Issue: 25.*

* cited by examiner

Primary Examiner—Albert Decady
Assistant Examiner—Cynthia Britt
(74) Attorney, Agent, or Firm—Carlton H. Hoel; W. James Brady; Frederick J. Telecky, Jr.

(57) ABSTRACT

A method of monitoring the performance of a Viterbi detector by using the deviations from the noiseless case of the path difference of the two branches entering the minimal state for a number of samples.

7 Claims, 6 Drawing Sheets

DETECTION ERROR ESTIMATION AND METHOD

This application is a Provisional of No. 60/128,341 filed on Apr. 8, 1999.

BACKGROUND OF THE INVENTION

The invention relates to electronic devices, and, more particularly, to low-complexity partial response detectors.

Magnetic recording systems for digital data storage may have a functional structure as illustrated in FIG. 1. Briefly, for a write of data to storage, data bits typically first receive error correction encoding (such as Reed-Solomon); this coding aims to correct errors generated in the write-read process and which escape correction by the detection method of the read process. Further, interleaving blocks of error corrected encoded bits helps correct bursts of errors by spreading the errors over many blocks. Next, the error correction encoded bits are modulation (channel) coded (such as runlength-limited coding); the modulation coding helps read timing recovery. A further preceding may help intersymbol interference decoding. Then the modulation-coded bits modulate the polarity of the write current in a read/write head over the magnetic media (e.g., a spinning disk) to set the magnetization directions of domains in the magnetic media. The pattern of magnetization directions is the stored data.

The read process begins with sensing the domain magnetization directions by voltages induced in the read/write head. After amplification the sensed voltages drive clocked analog-to-digital converters to yield a stream of digital samples. Noise in the read sensing, amplification, and conversion generates errors in the stream of digital samples. A detector (such as a peak detector or a Viterbi maximum likelihood detector) recovers the modulation encoded bits from the stream of digital samples. The modulation decoder then converts the coded bits to the error corrected bits, and lastly, the deinterleaver and error correction decoder corrects errors and recovers the data bits.

For partial response signaling various classes of frequency response for the signal channel prior to detection have been defined; and the class IV response appears particularly suitable for magnetic recording due to pulse shapes requiring minimal equalization. The partial response class IV channel is defined by a channel transfer function polynomial of the form $(1-D)(1+D)^N$ where N is a positive integer and D is a one period delay. FIGS. 2a–2c shows the pulse shapes for N=1, 2, and 3; the corresponding pulses are termed PR4, EPR4, and $E^2$PR4 (or EEPR4), respectively. Thus an (E)PR4 sensed voltage consists of a sequence of overlapping (E)PR4 pulses spaced one period apart and with positive, negative, or zero amplitudes depending upon the corresponding transitions of magnetization domain orientations. The sampling of the (E)PR4 sensed voltage yields the digital stream input to the detector, typically a sequence detector such as a maximum likelihood Viterbi decoder. Higher storage densities on a magnetic disk require more samples per induced pulse and consequent more overlap, and thus the higher order polynomial transfer functions are used. For example, storage densities of about 3 bits per PW50 (pulse width at half amplitude) would use $E^2$PR4 which has four nonzero samples per pulse; see FIG. 2c. The demand for high density originates with small, portable devices such as notebook computers.

The bit error rate (BER) of the Viterbi detector for systems using the maximum likelihood Viterbi detection of the digital samples can be minimized by tuning read channel parameters such as the continuous time filter and boost, FIR filter coefficients, MR asymmetry correction, and so forth. Known methods for estimating the BER of a particular Viterbi detector include (i) accumulation of the squared error in the equalized sampled values and (ii) accumulation of the number of events when the Viterbi branch metric falls below a fixed or programmed threshold. See Perkins et al, A Window-Margin-Like Procedure for Evaluating PRML Channel Performance, 31 IEEE Tr. Mag. 1109 (1995). But (i) the accumulated squared error does not directly correlate with the BER and (ii) accumulation of the number of under-threshold events requires large amounts of data for accurate results.

Similarly, U.S. Pat. No. 5,754,353, and U.S. Pat. No. 5,761,212 disclose channel quality monitoring systems.

SUMMARY OF THE INVENTION

The present invention provides a method of estimation of the bit error rate (BER) of a Viterbi detector by estimating the distribution of the margin between two path metrics entering each state that lies along the maximum likelihood path through the trellis.

This has the advantages of increased accuracy with limited required data acquisition.

BRIEF DESCRIPTION OF THE DRAWINGS

The drawings are heuristic for clarity.

DESCRIPTION OF THE PREFERRED EMBODIMENTS

System Overview

Figure 1:
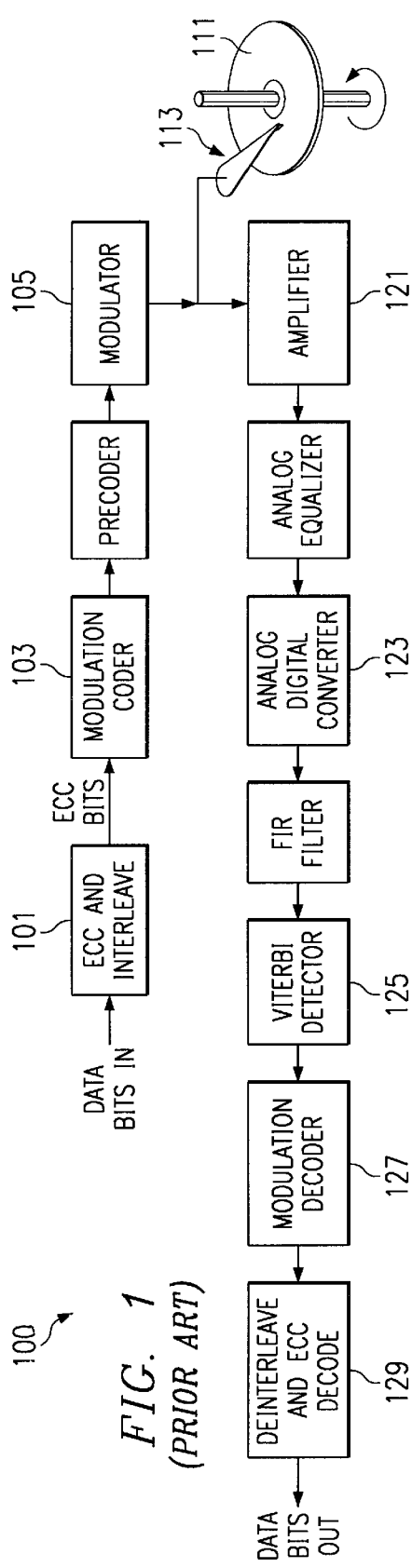
FIG. 1 schematically illustrates a magnetic data storage system.

FIG. 1 schematically illustrates a magnetic storage and retrieval system. In particular, writing data bits to storage on magnetic disk 111 proceeds as follows. Error correction coder 101 encodes data bits into error corrected bits by an error correction encoding method such as Reed-Solomon. Further, the error correction coding may include interleaving of blocks of bits. Next, modulation coder (channel coder) 103 codes blocks of bits output by error corrected coder 101 into blocks of bits using a runlength-limited code or other channel code which may include a parity bit for post processing removal of dominant errors. This modulation coding helps read timing recovery. These blocks may then be precoded. Then the (precoded) modulation coded bits drive the read/write head to set the magnetization orientation of domains on spinning magnetic disk 111; this stores the data bits.

Figure 2B:
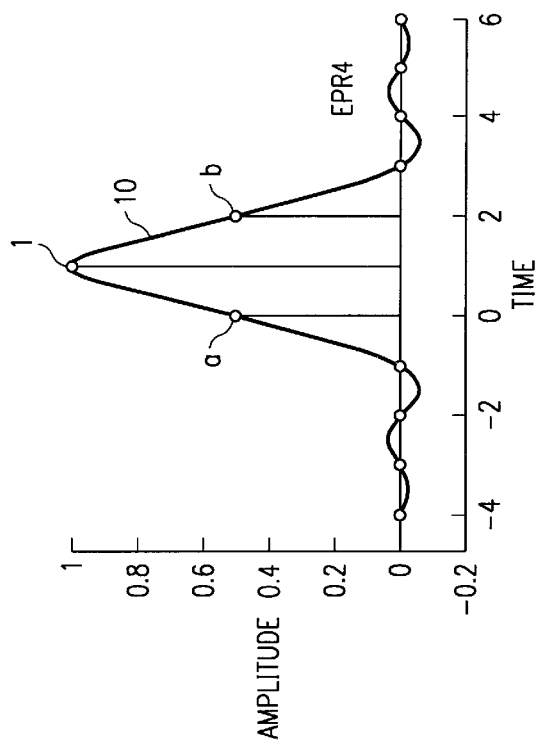
FIGS. 2a–2c shows partical response class IV pulses.
Figure 2A:
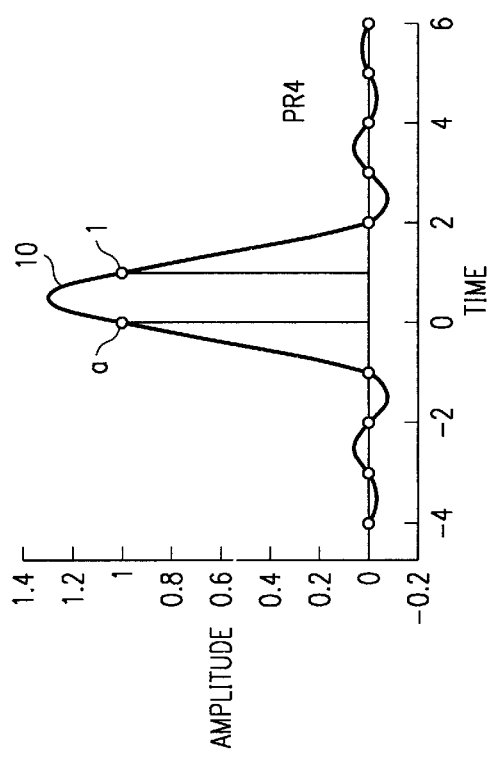
Figure 2C:
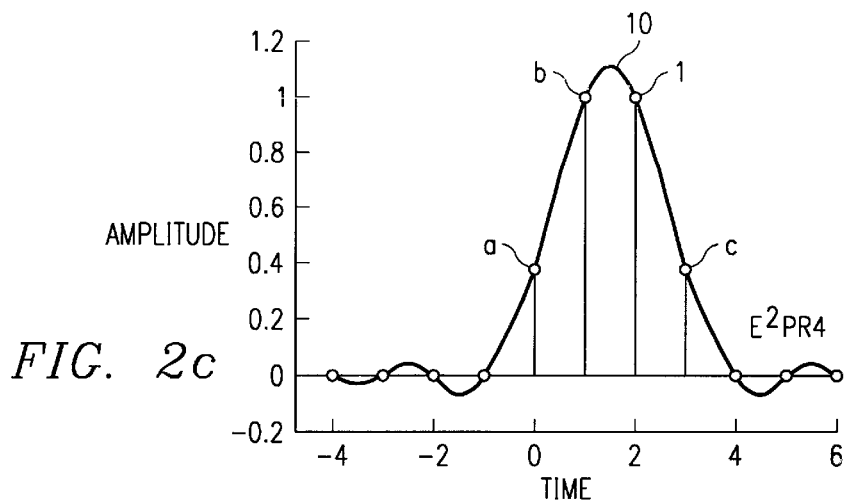

The reading of the stored data bits first amplifies (and filters) with amplifier 121 voltages induced in the read/write head 113 due to the transitions of magnetization orientation of domains on spinning disk 111. These voltages have the ideal form of a sequence of overlapping pulses, such as illustrated in FIGS. 2a–2c, with positive, negative, or zero amplitudes. The pulse overlaps imply intersymbol interference if the subsequent digital sampling includes contributions from more than one pulse; indeed, FIGS. 2a–2c indicate the ideal sampling times. Clocked analog-to-digital converter 123 samples and quantizes the sequence of pulses to form a digital output stream; there may be 64 or 128 quantization levels (a 6-bit or 7-bit converter with one sign bit and 5 or 6 magnitude bits). The Viterbi detector 125 performs a maximum likelihood data detection on the digital output stream.

Figure 3:
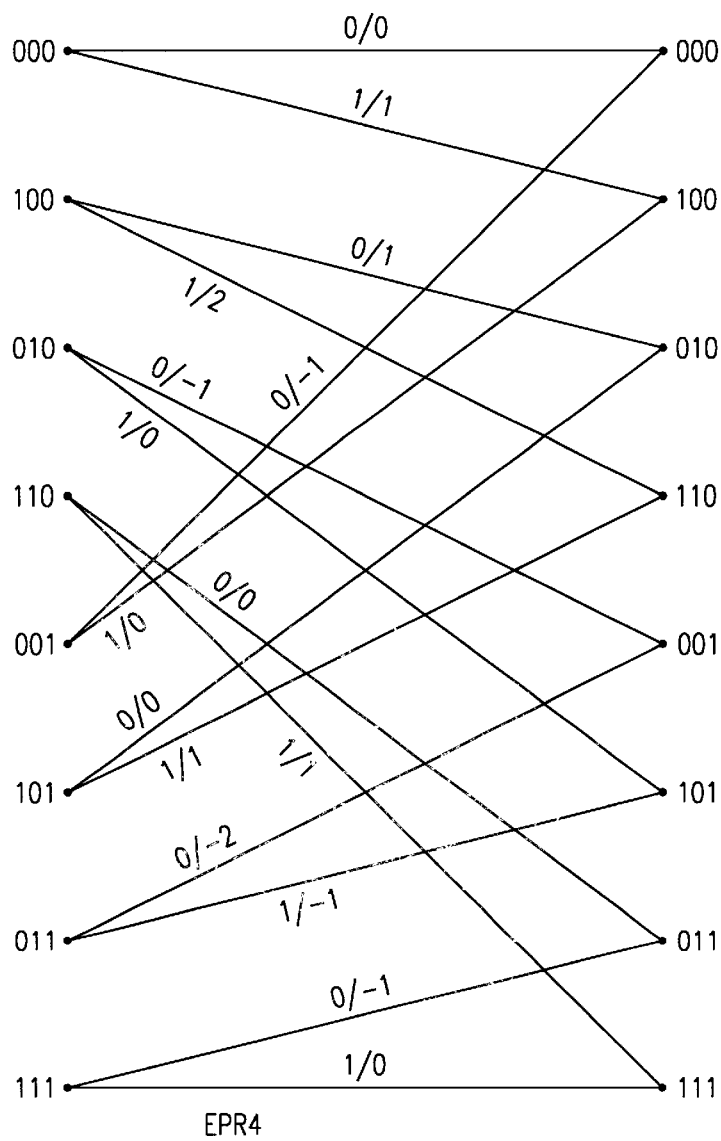
FIG. 3 illustrates a stage of an EPR4 trellis.

For modulation codes which include a parity bit, a post processor can detect correlations with dominant error patterns and make corrections if the parity warrants it. Modulation decoder 127 is the inverse of modulation coder 103. Lastly, error correction decoder 129 deinterleaves and further corrects errors and recovers the data bits, hopefully with only minimal errors. Maximum likelihood detection of a digital stream with intersymbol interference can be described in terms of maximizing probabilities of paths through a trellis of state transitions (branches); each state corresponds to a possible pattern of recently received data bits and each stage of the trellis corresponds to a receipt of the next (noisy) input. For example, FIG. 3 illustrates one stage (one step in time) in the trellis for an EPR4 detector; the states are labeled with three previous data bits (reflecting the three non-zero sampled values in the isolated pulse) and the branches are labeled with the bit for the branch transition plus the corresponding noiseless input sample target values: 2,1,0,–1, or –2.

Figure 4:
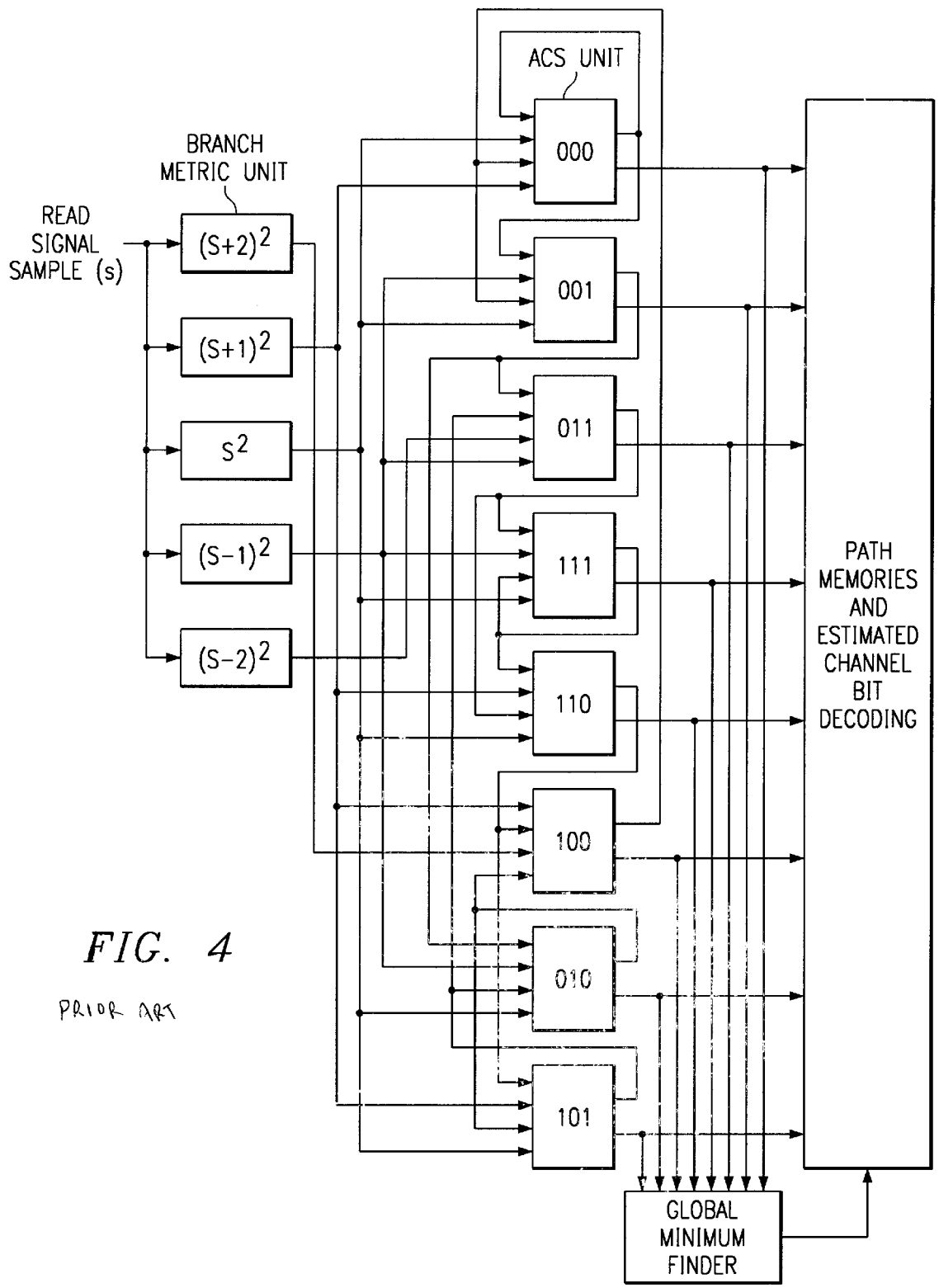
FIG. 4 shows a Viterbi detector.

FIG. 4 shows a prior art Viterbi detector which includes one add-compare-select (ACS) unit for each trellis state and a branch metric unit for each of the target levels tij; the survival register for each state is in the path memories block. Each branch metric unit computes the square of the difference between its target value and the noisy input sample value. Each ACS stores a metric for its state and has inputs for the appropriate branch metric computations and the related state metrics from other ACS units. At receipt of an input signal to the detector, each ACS adds its (two) input branch metric computations to the corresponding state metrics of the states emitting the branches; and then it compares these (two) sums and selects the smaller as the updated state metric for its state. Each states survival register up dates its contents to maintain a survival path for the state; that is, the sequence of selected bits (transitions) that have led to the updated state metric. The detected bits will correspond to the path with the smallest metric. At any time the maximum likelihood path through the trellis up to that time is the path traced backwards through the trellis starting from the state with the smallest state metric at that time and recursively using the branch previously selected as the branch into the traced-to state. That is, the survival register contents for the state with the smallest state metric.

The length of the survival registers depends on the modulation code used. As the decision goes deeper into the survival registers, more of the contesting survival paths (versus the correct path) will be eliminated, the detected data will become more accurate.

Figure 5:
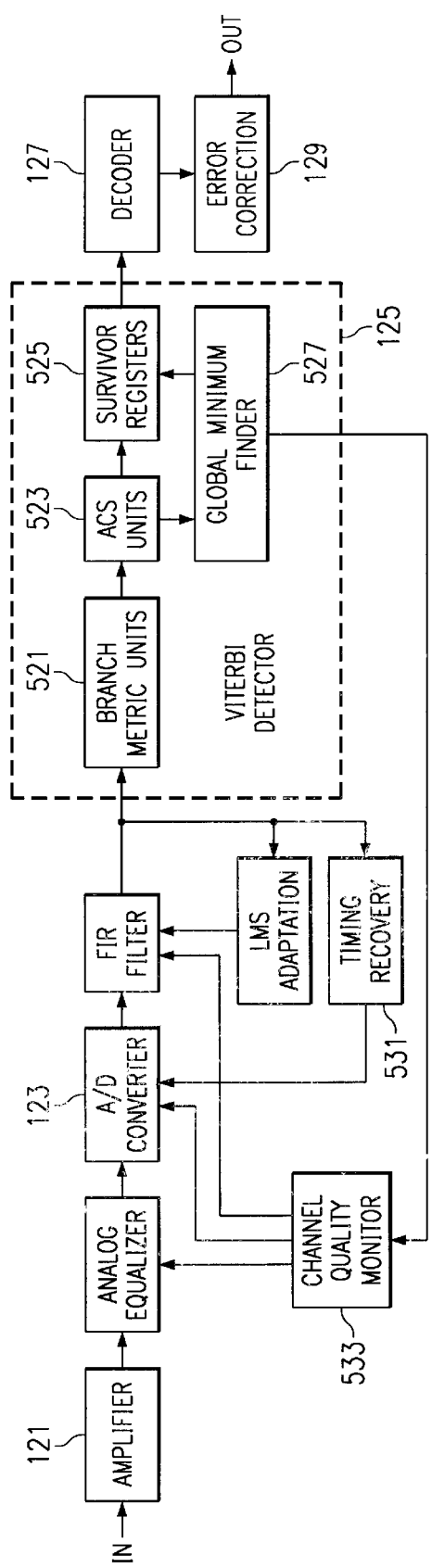
FIG. 5 is a preferred embodiment system schematic diagram.

FIG. 5 shows part of the read channel of FIG. 1 including components of Viterbi detector 125 such as branch metric units 521, ACS units 523, survival registers 525, and global minimum finder 527 plus timing recovery circuitry 531 and channel quality monitoring (CQM) circuitry 533 which uses the path metric difference at the state with the smallest resulting state metric to estimate the BER as described in the following sections. The BER estimate can be used to adjust coefficients in the continuous-time filter, FIR filter, and other channel parameters.

BER Estimation

A preferred embodiment method of estimating the bit error rate (BER) of the Viterbi detector 125 accumulates the squared error of the path metric decision margin. The following describes this in more detail using the EPR4 channel as an example for explanation.

The preferred embodiment estimates the bit error rate of Viterbi detector 125 as follows. At each stage through the trellis, each ACS unit compares the two competing path metrics and selects the smaller as its updated state metric. That is, at time t for state i, let sm(i;t−1) be the state metric stored from the previous stage and let bm(ji;t) and bm(ki;t) be the branch metrics for the branches from states j and k to state i at time t, respectively. Note that bm(ki;t) typically is defined as either $(x(t)-t_{ki})^2$ or as $|x(t)-t_{ki}|$ where x(t) is the input sample and $t_{ji}$ and $t_{ki}$ are the target sample values for these branches. Then the updated state metric sm(i;t) for time t is taken to be the smaller of path metric pm(ji;t)=sm(j;t−1)+bm(ji;t) and path metric pm(ki;t)=sm(k;t−1)+bm(ki;t). The difference between the two path metrics is retained as, Δpm(i;t). Next, the global minimum finder selects the ACS unit with the smallest state metric; this is the most likely state to lie in the eventual maximum likelihood path for time t. Presume that this smallest state metric is for state i; then use Δpm(i;t) for computing the Viterbi BER estimation.

For the EPR4 channel with targets of 2, 1, 0, −1 and −2, the noiseless case has the correct path with bm( . . . ,t)=0 and sm( . . . ,t)=0 for all t and has |Δpm|=4 because the closest competing trellis path accumulates a metric error of $dmin^2 = 1^2+1^2+1^2+1^2=4$. Indeed, see FIG. 3 which shows that for the noiseless case |Δbm|=1 for the two branches leaving a state and also |Δbm|=1 for the two branches entering a state. Thus in the noiseless case, the state with the smallest state metric has the correct path branch entering the state with pm=0 and a competing path with pm=4.

But in the noisy case the difference of the competing path metrics implies Δpm varies from the noiseless case; and the greater the noise magnitude, the more Δpm varies. Indeed, when the difference Δpm is zero or negative (incorrect path metric minus correct path metric), the Viterbi detector makes a decision error. Thus an estimate of the (variance of the) distribution of Δpm will provide an estimate of the BER.

Figure 6:
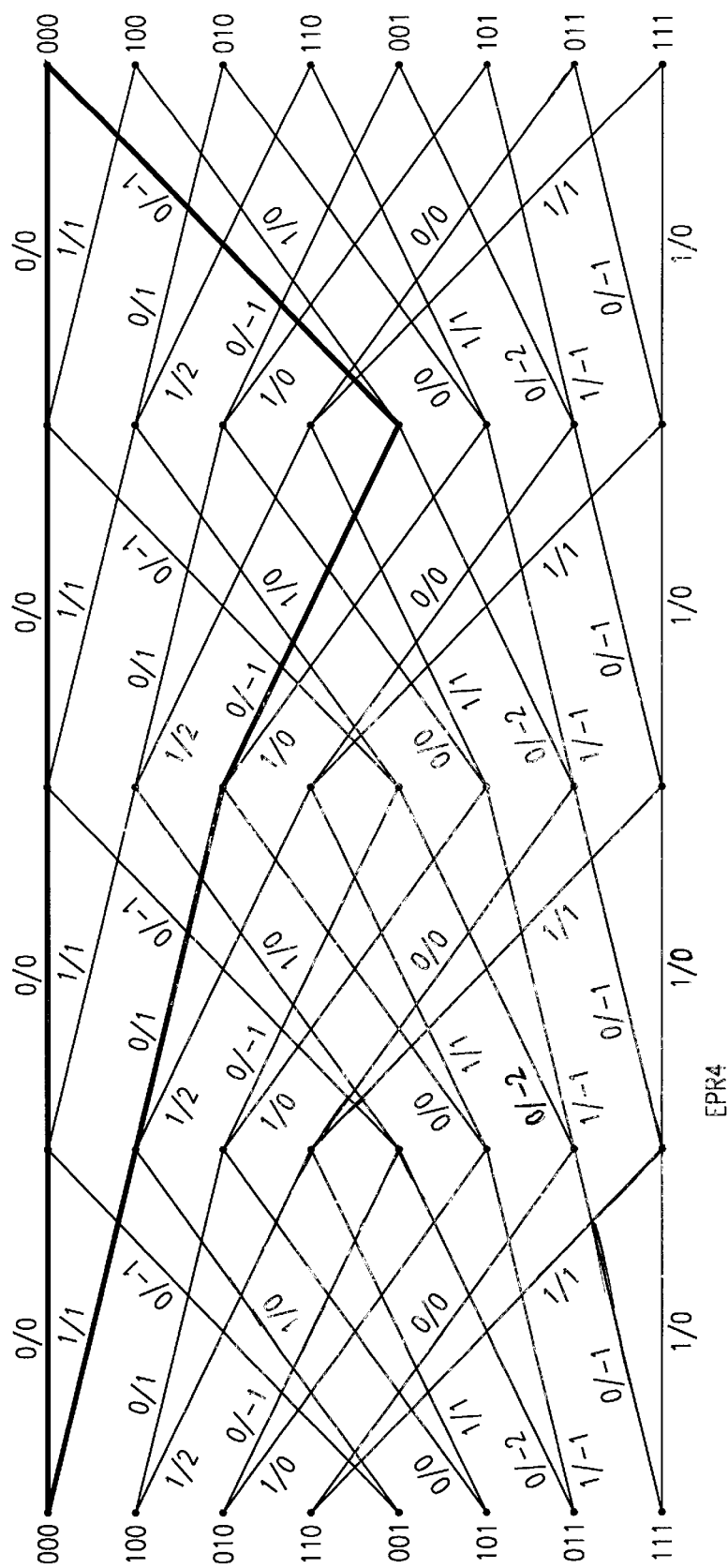
FIG. 6 shows trellis paths.

FIG. 6 illustrates two paths along the EPR4 trellis with a minimum path metric difference at time t. The values $t_{ii}$, $t_{ij}$, $t_{jk}$, $t_{kl}$, and $t_{li}$ respectively represent the corresponding channel targets for transitions from state i to state i, and from state i then to state j, then to state k, then to state 1, then back to state i. In FIG. 6 state i is 000, state j is 100, state k is 010, and state 1 is 001. At the time t−4, the state metric at state i is sm(i;t−4). Following the path that remains at state i, the path metric entering state i from state i at time t is:

$$pm(ii;t)=sm(i;t-4)+bm(ii;t-3)+bm(ii;t-2)+bm(ii;t-1)+bm(ii;t)$$

$$=sm(i;t-4)+(x(t-3)-t_{ii})^2+(x(t-2)-t_{ii})^2+(x(t-1)-t_{ii})^2+(x(t_{ii})-t_{ii})^2$$

The competing path metric entering state i from state l at time t is:

$$pm(li;t)=sm(i;t-4)+bm(ii;t-3)+bm(ii;t-2)+bm(ii;t-1)+bm(ii;t)$$

$$=sm(i;t-4)+(x(t-3)-t_{ii})^2+(x(t-2)-t_{ii})+(x(t-1)-t_{ii})+(x(t)-t_{ii})^2$$

Therefore, the path metric difference for state i at time t is:

$$\Delta pm=pm(ii;t)-pm(li;t)$$

$$=sm(i;t-4)+(x(t-3)-t_{ii})^2+(x(t-2)-t_{ii})^2+(x(t-1)-t_{ii})^2+(x(t)-t_{ii})^2$$

$$-[sm(i;t-4)+(x(t-3)-t_{ij})^2+(x(t-2)-t_{jk})^2+(x(t-1)-t_{kl})^2+(x(t)-t_{li})^2]$$

For this case, the path that remains at state i is correct. If we set $x(t)=t_{ii}+z(t)$, where $z(t)$ is normally distributed noise with mean 0 and standard deviation $\sigma_z$, then we get $$\Delta pm=(z(t-3)+t_{ii}-t_{ii})^2+(z(t-2)+t_{ii}-t_{ii})^2+(z(t-1)+t_{ii}-t_{ii})^2+(z(t)+t_{ii}-t_{ii})^2$$

$$-[(z(t-3)+t_{ii}-t_{ij})^2+(z(t-2)+t_{ii}-t_{jk})^2+(z(t-1)+t_{ii}-t_{kl})^2+(z(t)+t_{ii}-t_{li})^2]$$

Since $|t_{ii}-t_{ij}|=|t_{ii}-t_{jk}|=|t_{ii}-t_{kl}|=|t_{ii}-t_{lk}|=1$, $$|\Delta pm|=4+2z(t-3)+2z(t-2)+2z(t-1)+2z(t)$$

where the, signs of the $(t_{ii}-t_{kj})$s multiplying the $2z(t-m)$s have been ignored due to the symmetry and independence of the $z(t-m)$s.

Figure 7B:
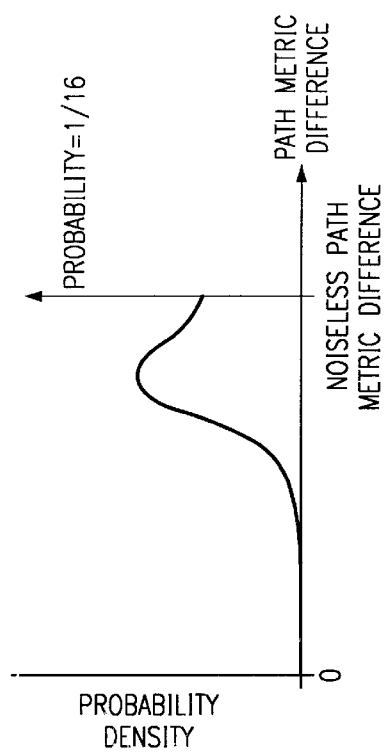
FIGS. 7a–7b are probability distribution graphs.
Figure 7A:
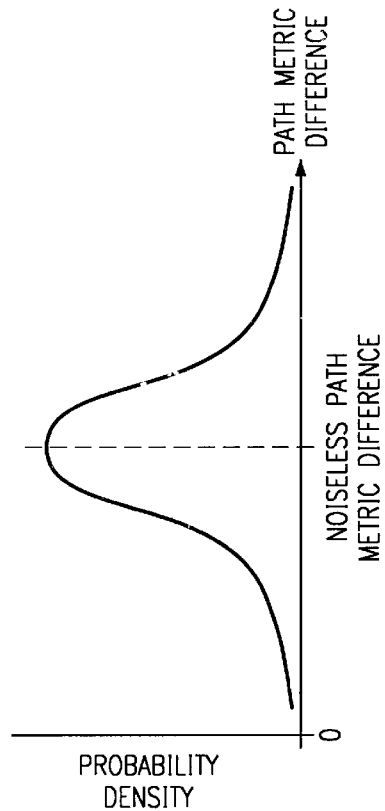

Because the $z(t-m)$s are independent, the sum of the $2z(t-m)$s is normally distributed with mean 0 and standard deviation $4\sigma_z$. FIG. 7a illustrates the distribution of $|\Delta pm|$ with for the branch metric defined by $(x(t)-t_{ki})^2$; this distribution is centered about the noiseless path metric difference of 4.

Similarly, for the branch metric defined by $|x(t)-t_{ki}|$ the path metric difference $\Delta pm$ for state i at time t is:

$$\Delta pm=pm(ii;t)-pm(li;t)$$

$$=sm(i;t-4)+|x(t-3)-t_{ii}|+|x(t-2)-t_{ii}|+|x(t-1)$$

$$-t_{ii}|+|x(t)-t_{ii}|-[sm(i;t-4)+|x(t-3)-t_{ij}|+|x(t-2)-t_{jk}|+|x(t-1)-t_{kl}|+|x(t)-t_{li}|]$$

If we set $x(t)=t_{ii}+z(t)$, where $z(t)$ again is normally distributed noise, then we get $$\Delta pm=|z(t-3)|+|z(t-2)|+|z(t-1)|+|z(t)|$$

$$-[|z(t-3)+t_{ii}-t_{ij}|+|z(t-2)+t_{ii}-t_{jk}|+|z(t-1)+t_{ii}-t_{kl}|+|z(t)+t_{ii}-t_{li}|]$$

Since $|t_{ii}-t_{ij}|=|t_{ii}-t_{kl}|=|t_{ii}-t_{kl}|=|t_{ii}-t_{lk}|=1$, $$|\Delta pm|=4-w(t-3)-w(t-2)-w(t-1)-w(t)$$

where for $|z(t-m)|$ smaller than 1 (the overwhelming most likely case), $w(t-m)=|z(t-m)|\pm z(t-m)$ with the plus sign if the corresponding $t_{ii}-t_{jk}=+1$ and the minus sign if $t_{ii}-t_{jk}=-1$. Thus $w(t-m)=2|z(t-m)|$ or 0, each with probability about ½. Then find the distribution of $|\Delta pm|$ by convolution of the $w(t-m)$ distributions. FIG. 7b illustrates the distribution of $|\Delta pm|$ which includes a discrete $\delta(.)/16$ at 4 plus a continuous portion at less than 4. The mean of $|\Delta pm|$ is approximately $4(1-\sigma_z/2\sqrt{2\pi})$.

To assess the distribution of $|\Delta pm|$ (and thus the noise and hence the BER), in the case of the square branch metric, for each sample subtract $|\Delta pm|$ from the expected value $E[|\Delta pm|]$ (i.e., 4 times the difference between target values) and square the result, and accumulate these squares. The squaring emphasizes the larger values of $|\Delta pm|-E[|\Delta pm|]$; and a significant sum of squares can be accumulated in less time. In fact, the variance of a normal distribution can be calculated from this accumulated value. For N samples accumulated, the mean squared error of the path metric is:

$$MSE_{pm}=\frac{1}{N}\sum_{k=1}^{N}(|\Delta pm|-E[|\Delta pm|])^2$$

And the root mean squared (RMS) ($\sqrt{MSE}$) is an estimate for the standard deviation of $|\Delta pm|$ which is approximately $4\sigma_z$.

Analogously, to assess the distribution of $|\Delta pm|$ in the case of the absolute value branch metric, for each sample subtract $|\Delta pm|$ from 4 (i.e., 4 times the target value difference) and square, and accumulate the squares. The difference $4-|\Delta pm|$ has a mean of approximately $4\sigma_z/2\sqrt{2\pi}$; this contrasts with the square branch metric and a sum without squaring could be used to recover $\sigma_z$. However, squaring the differences again emphasizes the larger values and a more rapid accumulation. Thus use:

$$\frac{1}{N}\sum_{k=1}^{N}(|\Delta pm|-4)^2$$

as an estimate for $(4\sigma_z)^2/8\pi$ or the square root as an estimate for $4\sigma_z/2\sqrt{2\pi}$.

For a particular memory system, tune the read channel parameters to minimize this sum of squares. In particular, an external microprocessor can use channel quality monitor circuit 533 as it optimizes the read channel parameters. Alternatively, channel quality monitor circuit 533 itself could periodically accumulate the sum of squares and use a stored lookup table to adjust the read channel parameters in response to the sum of squares.

Figure 8:
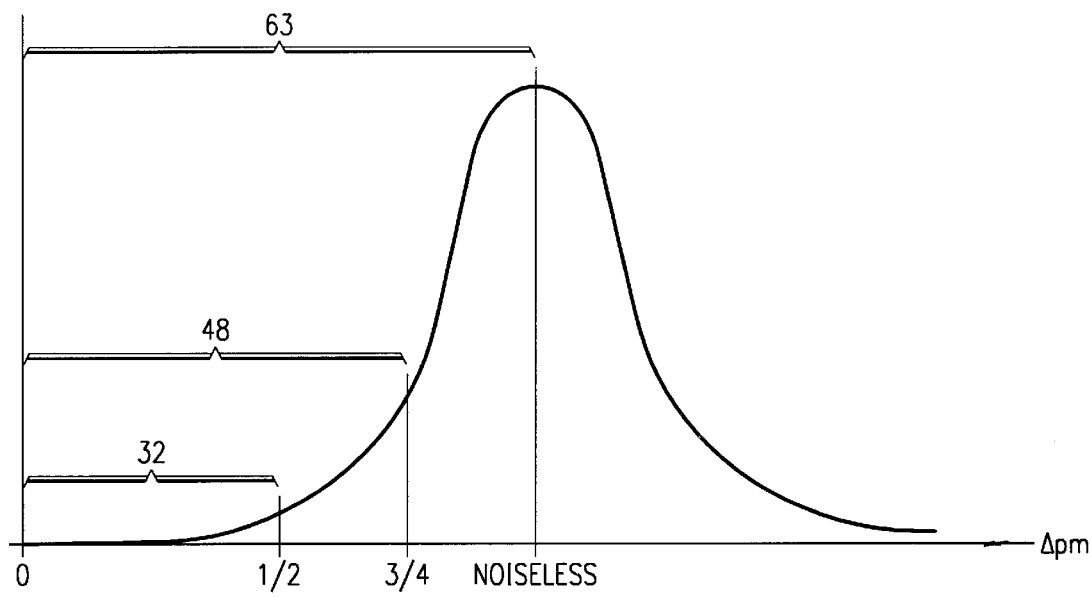
FIG. 8 illustrates clipping.

Another method to assess the distribution of $|\Delta pm|$ clips the values prior to the squaring; this permits further emphasis of the larger values. In particular, presume 7 bits are used for $|\Delta pm|$ in the range 0 to +8 (recall EPR4 has the noiseless path metric difference $|\Delta pm|$ equal to 4), then $\Delta pm$ has 128 levels with level 64 corresponding to $|\Delta pm|=4$, the noiseless level. Then during each computation of $|\Delta pm|$, clip its level to 63, 48, or 32; this corresponds to the noiseless level minus (1/64), ¾ noiseless level, and ½ noiseless level, respectively, and essentially retains only part of the tail of the distribution of $|\Delta pm|$ as illustrated in FIG. 8. After clipping $|\Delta pm|$, subtract the value from the clipping level and then square; this emphasizes the values away from the clipping level. Accumulate these squares and the sum as the BER assessment. Of course, the clipping level could be made programmable with differing levels for differing noise levels. Further, the hardware could be simplified by omitting the squaring after clipping and subtraction, but this would lose some sensitivity.

Experimental Results

Figure 9:
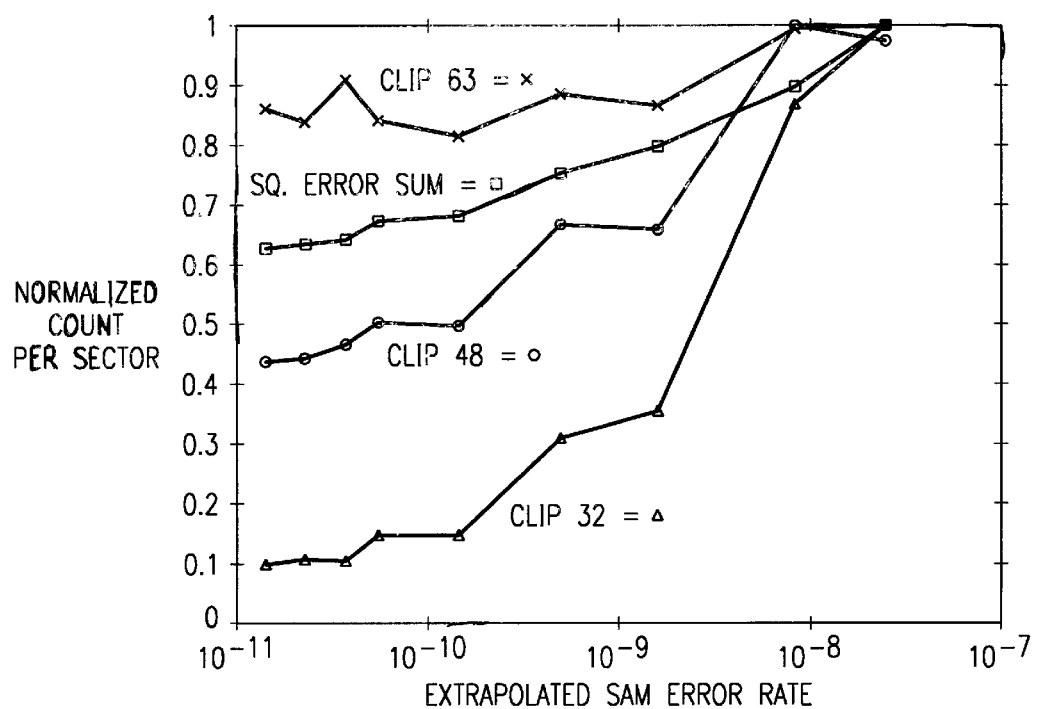
FIG. 9 shows experimental results.

FIG. 9 shows experimental results for the clipping levels 63, 48, and 32 with a comparison sum of squares of sample errors curve all measured as normalized numbers o(f errors per sector on a magnetic disk as functions of the sequenced amplitude margin (SAM) error rate. This shows that the preferred embodiment method with different clipping levels does correlate with BER.

Modifications

The preferred embodiments can be modified in various ways while retaining the feature of a branch metric difference (margin) assessment of BER.

For example, the preferred embodiment clipping levels could be varied, the squares (clipping level–clipped $|\Delta pm|)^2$ could be replaced by other functions of the difference, and so forth.

What is claimed is:

1. A method of assessing the bit error rate with a sequential detector, comprising the steps of:

(a) estimate the margin between two path metrics entering a state for each state along the maximum likelihood path through a trellis;

(b) use the estimate of step (a) to assess the bit error rate.

2. The method of claim 1, wherein:

(a) said use the estimate of step (b) of claim 1 includes an estimate of the variance of the margin.

3. The method of claim 2, wherein:
(a) said margin of step (a) of claim 1 has a normal distribution.

4. The method of claim 1, wherein:
(a) said use the estimate of step (b) of claim 1 includes clipping the margin and estimating the variance of the clipped margin.

5. The method of claim 1, wherein:
(a) said path metric of step (a) of claim 1 is a sum of a state metric plus a branch ,metric, with said branch metric a square of the difference of a sample value and a branch target value.

6. The method of claim 1, wherein:
(a) said path metric of step (a) of claim 1 is a sum of a state metric plus a branch metric, with said branch metric an absolute value of the difference of a sample value and a branch target value.

7. A method of channel quality control, comprising the steps of:
(a) estimate the margin between two path metrics entering a state for each state along the maximum likelihood path through a trellis;
(b) use the estimate of step (a) to assess the bit error rate; and
(c) adapt a channel in response to the assessment of step (b).

* * * * *